United States Patent [19]  [11]  4,316,149
Yamaguchi  [45]  Feb. 16, 1982

[54] POWER AMPLIFIER

[75] Inventor: Hiroyasu Yamaguchi, Yokohama, Japan

[73] Assignee: Tokyo Shibaura Denki Kabushiki Kaisha, Japan

[21] Appl. No.: 135,128

[22] Filed: Mar. 28, 1980

[30] Foreign Application Priority Data

Mar. 31, 1980 [JP]  Japan .................................. 54-38637

[51] Int. Cl.$^3$ ............................................. H03F 3/26
[52] U.S. Cl. .................................... 330/268; 330/274; 330/255
[58] Field of Search ............... 330/255, 258, 265, 268, 330/270, 274

[56] References Cited
U.S. PATENT DOCUMENTS 4,176,323  11/1979  Odell .................................. 330/268

Primary Examiner—James B. Mullins
Assistant Examiner—Gene Wan
Attorney, Agent, or Firm—Finnegan, Henderson, Farabow, Garrett & Dunner

[57] ABSTRACT

A power amplifier being controlled by a feedback signal which is related to a product of currents each flowing through power transistors in an SEPP configuration. Current detecting transistors are connected in parallel at their base-emitter paths to the base-emitter paths of the power transistors, respectively, and detect respective currents flowing through the power transistors. An operating circuit is coupled to the current detecting transistors, and generates a current related to the product of the detected currents.

12 Claims, 5 Drawing Figures

POWER AMPLIFIER

FIELD OF THE INVENTION

The present invention relates to a power amplifier, and in particular to an amplifier having a single ended push-pull (SEPP) output stage.

BACKGROUND OF THE INVENTION

A power amplifier for power-amplifying an analog signal, e.g., an audio signal, must have a high power output efficiency in a large signal to noise ratio (S/N) condition, since the amplifier is used in general as an audio amplifier. An SEPP output stage consists of two amplifying sections connected to a common load circuit. One section of the SEPP output stage amplifies half cycles of an analog AC signal, and the other section amplifies the other half cycles of the AC signal.

In a conventional power amplifier, the two sections of an SEPP stage comprise two power transistors with at least one transistor being wired in an emitter-follower circuit configuration, and with a biasing circuit positioned as a pre-stage of the SEPP section. The conventional power amplifier, however, has several disadvantages mentioned below.

First, the biasing circuit is complicated, especially for an SEPP stage constructed by an emitter-grounded configuration at both sections.

Second, the power transistors are apt to be harmed by over current flowing when a large input signal is added so that the amplifier needs some form of protection circuit.

Third, the power transistors enter a cutoff condition when there is no signal at the base terminals of the transistors, so that the output signal includes a clipping noise.

Fourth, output amplitude is limited due to the use of an emitter-follower configuration, with a resistor for the biasing circuit or a resistor for an idling current circuit.

Accordingly, an object of the present invention is to provide a power amplifier with an improved biasing circuit.

A further object of the present invention is to provide a power amplifier which prevents an over current flowing through the power transistors.

Another object of the present invention is to provide a power amplifier with a small current flowing through the power transistors when there is no signal at the base of the power transistors.

A still further object of the present invention is to provide a power amplifier having a large output efficiency.

SUMMARY OF THE INVENTION

According to the present invention, a power amplifier is provided with: a preamplification stage; an output stage driven by the preamplification stage and having power transistors each coupled to a common output terminal; current detecting transistors connected in parallel at their base-emitter paths to the base-emitter paths of the power transistors for detecting currents flowing through the power transistors, respectively; an operating circuit coupled to the current detecting transistors, the operating circuit generating a feed back current which has a function related to the product of the respective currents through the power transistors; and means for feeding back the feed current from the operating circuit to the preamplification stage for keeping the feed back current constant.

Preferably, the power amplifier according to the present invention further includes a driver stage between the preamplification stage and the output stage. The output stage may comprise a pair of one conductivity type power transistors in which one of the power transistors is wired in a form of emitter-follower configuration and the other of the power transistors is wired in a form of grounded-emitter configuration.

The operating circuit preferably includes first and second transistors connected with emitter-collector path in series, respectively, to the emitter-collector paths of the current detecting transistors; first means for connecting the base-emitter paths of said first and second transistors in series; third and fourth transistors; second means for connecting the base-emitter paths of the third and fourth transistors in series circuit and for connecting the series base-emitter paths of third and fourth transistors in parallel with the base-emitter paths of the first and second transistors; and third means for connecting at least one of the collectors of the third and fourth transistors to the feedback means.

The first transistor is preferably a first conductivity type transistor connected at the collector to one of the current detecting transistors and to its own base and connected at the emitter to a power source terminal; the second transistor is preferably an opposite conductivity type transistor connected at the emitter to the other one of the current detecting transistors at the collector to said power terminal; the first means is preferably a connection between the bases of the first and second transistors; the third transistor is preferably of the first conductivity type, the fourth transistor is preferably of the opposite conductivity type transistor and is connected at the collector to both the power source terminal and to its own base; and the second means is preferably a connection between the emitters of the third and fourth transistors and between the emitter of the second transistor and the base of the third transistor.

In an alternative embodiment, the first and second transistors are preferably opposite conductivity type transistors respectively connected at their collectors to one of the current detecting transistors and to their own bases; the first means is a connection between emitters of the first and second transistors; the third and fourth transistors are opposite conductivity type transistors; and the second means is a connection between the bases of the third and fourth transistors and further is a connection between the bases of the first and third transistors and between the second and fourth transistors.

Additional objects and advantages of the present invention will become apparent to persons skilled in the art from a study of the following description and from the accompanying drawings.

DESCRIPTION OF THE PREFERRED EMBODIMENTS

Figure 1:
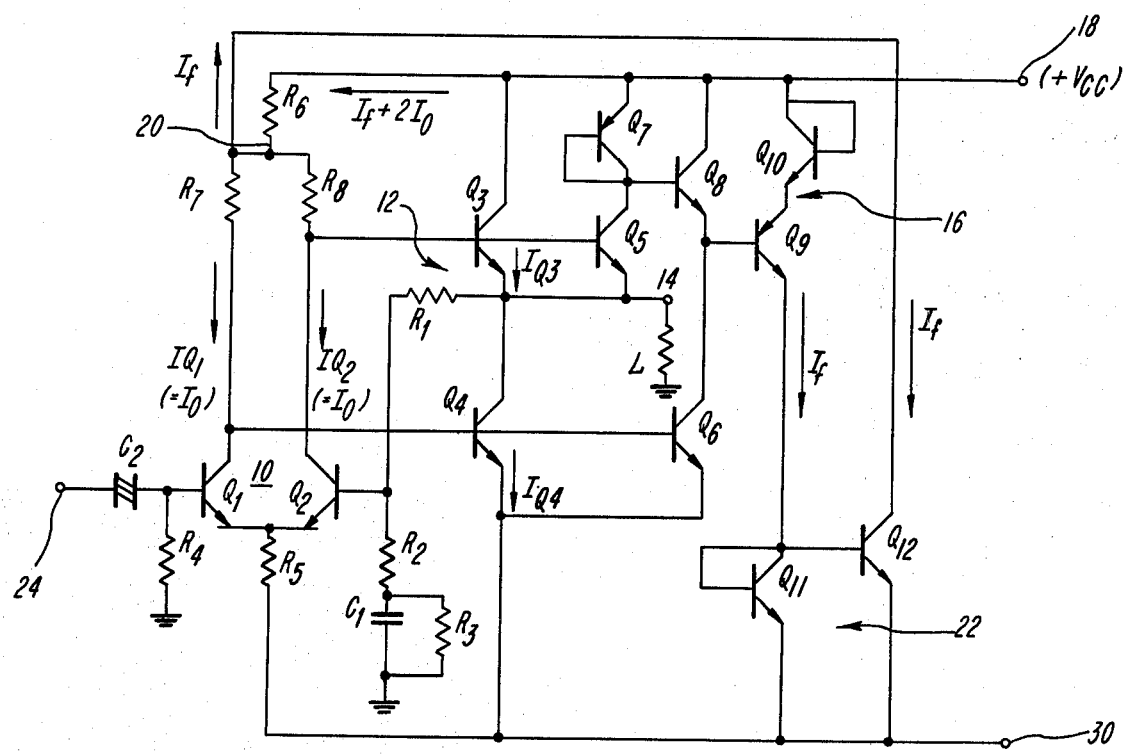
FIG. 1 shows a circuit diagram of a power amplifier embodying the present invention.

The present invention will be described in detail with reference to the accompanying drawings. Throughout the drawings, like reference numerals will be used to designate like or equivalent portions, for simplicity of explanation.

Referring now to FIG. 1, there is shown an amplifier of one embodiment of this invention in which an output stage is constructed in a single ended push-pull (SEPP) amplifier configuration by using two NPN power transistors.

A preamplification stage 10 in the form of a differential amplifier including NPN transistors $Q_1$ and $Q_2$ drives output stage 12. In output stage 12, power transistors $Q_3$ and $Q_4$ are connected in the form of an SEPP amplifier which drives load L through a common output terminal 14. A feedback through resistors $R_1$, $R_2$, $R_3$ and capacitor $C_1$ provides an operating point stabilization of the voltage drops across the power transistors $Q_3$ and $Q_4$.

An input coupling network having a resistor $R_4$, a transistor input impedance and a capacitor $C_2$, determines the low frequency roll-off of the amplifier since the remainder of the amplifier is essentially direct coupled. Accordingly, collectors of transistors $Q_1$ and $Q_2$ are respectively direct-coupled to bases of the power transistors $Q_4$ and $Q_3$, respectively.

Resistor $R_5$ operates as common emitter resistor for the differential amplifier transistor pair $Q_1$ and $Q_2$, and resistors $R_6$, $R_7$ and $R_8$ operate as collector load resistors of the transistors $Q_1$ and $Q_2$.

Determining idle currents for the power transistors $Q_3$ and $Q_4$ is achieved by further circuits having transistors $Q_5$, $Q_6$, $Q_7$, $Q_8$, $Q_9$ and $Q_{10}$ connected between the bases of the power transistors $Q_3$ and $Q_4$ and the preamplification stage 10. Base-emitter paths of NPN transistors $Q_5$ and $Q_6$ are respectively coupled to the base-emitter paths of power transistors $Q_3$ and $Q_4$ in parallel for detecting currents $IQ_3$ and $IQ_4$ which flow through the power transistors $Q_3$ and $Q_4$. Thus, if a ratio of the emitter area of transistor $Q_3$ to that of transistor $Q_5$ is N, and the ratio of the emitter area of the transistor $Q_4$ to that of the transistor $Q_6$ is M, currents $IQ_5$ and $IQ_6$ flowing through transistors $Q_5$ and $Q_6$ are respectively related by equations (1) and (2):

$$IQ_5 = 1/N \cdot IQ_3 \tag{1}$$

$$IQ_6 = 1/M \cdot IQ_4 \tag{2}$$

These currents $IQ_5$ and $IQ_6$ are combined and arithmetically operated upon by an operating circuit 16 comprising the transistors $Q_7$, $Q_8$, $Q_9$ and $Q_{10}$. The PNP transistor $Q_7$ is connected between transistor $Q_5$ and power source terminal 18, and the NPN transistor $Q_8$ is connected between transistor $Q_6$ and power source terminal 18. Thus, the currents $IQ_5$ and $IQ_6$ respectively flow through transistors $Q_7$ and $Q_8$. The forward base-emitter voltages $V_{BE}(Q_7)$ and $V_{BE}(Q_8)$ respectively of transistors $Q_7$ and $Q_8$ vary in accordance with the currents, $IQ_5$ and $IQ_6$, and are related by equations (3) and (4):

$$V_{BE}(Q_7) = \frac{KT}{q} \cdot \ln \frac{IQ_5}{I_{SP}} = \frac{KT}{q} \cdot \ln \frac{IQ_3}{N \cdot I_{SP}} \tag{3}$$

$$V_{BE}(Q_8) = \frac{KT}{q} \cdot \ln \frac{IQ_6}{I_{SN}} = \frac{KT}{q} \cdot \ln \frac{IQ_4}{M \cdot I_{SN}} \tag{4}$$

where K is Boltzman's constant, q is an electron charge, T is an absolute temperature, $I_{SP}$ is a reverse saturation current of a PNP transistor, and $I_{SN}$ is a reverse saturation current of an NPN transistor.

The transistor $Q_7$ is connected at the collector to both its own base and to the base of transistor $Q_8$, so that the emitter potential $P_E(Q_8)$ of transistor $Q_8$ becomes the sum of both base-emitter voltages $V_{BE}(Q_7)$ and $V_{BE}(Q_8)$. Accordingly, the emitter potential $P_E(Q_8)$ is related by equation (5):

$$P_E(Q_8) = V_{BE}(Q_7) + V_{BE}(Q_8) \tag{5}$$

The base of PNP transistor $Q_9$ is connected to the emitter of the transistor $Q_8$. The emitter of transistor $Q_9$ is connected to power source 18 through NPN transistor $Q_{10}$, and the base of transistor $Q_{10}$ is also connected to power source terminal 18, so that the sum of forward base-emitter voltages $V_{BE}(Q_9)$ and $V_{BE}(Q_{10})$ of the series transistors $Q_9$ and $Q_{10}$ is provided by the emitter potential $P_E(Q_8)$ of transistor $Q_9$, as shown by equation (6):

$$P_E(Q_8) = V_{BE}(Q_9) + V_{BE}(Q_{10}) \tag{6}$$

From the equations (5) and (6), the following equation is obtained:

$$V_{BE}(Q_9) + V_{BE}(Q_{10}) = V_{BE}(Q_7) + V_{BE}(Q_8) \tag{7}$$

Thus, the sum of the base-emitter voltages $V_{BE}(Q_9)$ and $V_{BE}(Q_{10})$ varies in accordance with a variation of the emitter potential $P_E(Q_8)$. The base-emitter voltages $V_{BE}(Q_9)$ and $V_{BE}(Q_{10})$ are respectively given by equations (8) and (9) in relation to a current $I_f$ flowing through the series transistors $Q_9$ and $Q_{10}$:

$$V_{BE}(Q_9) = \frac{KT}{q} \cdot \ln \frac{I_f}{I_{SP}} \tag{8}$$

$$V_{BE}(Q_{10}) = \frac{KT}{q} \cdot \ln \frac{I_f}{I_{SN}} \tag{9}$$

The equation (7) is rewritten as following, using the equations (3), (4), (8) and (9):

$$\frac{KT}{q} \cdot \ln \frac{I_f}{I_{SP}} + \frac{KT}{q} \cdot \ln \frac{I_f}{I_{SN}} = \frac{KT}{q} \cdot \ln \frac{IQ_3}{N \cdot I_{SP}} + \frac{KT}{q} \cdot \ln \frac{IQ_4}{M \cdot I_{SN}} \tag{10}$$

From the equation (10), the following equations are obtained:

$$I_f^2 = \frac{1}{N \cdot M} \cdot IQ_3 \cdot IQ_4 \tag{11}$$

And:

$$I_f = \sqrt{\frac{1}{N \cdot M} \cdot IQ_3 \cdot IQ_4} = K \cdot \sqrt{IQ_3 \cdot IQ_4} \tag{12}$$

where, $K = \sqrt{\frac{1}{NM}}$

The current $I_f$ flows into a diode-connected NPN transistor $Q_{11}$ which is connected in a current mirror circuit 22 with an NPN transistor $Q_{12}$, so that a current equal to the current $I_f$ is obtained in the circuit of the transistor $Q_{12}$. This current $I_f$ is drawn out from the junction 20 of resistors $R_6$, $R_7$ and $R_8$ and works as a feedback signal for controlling the pre-amplification stage 10.

Referring to voltage drops by the current $I_f$ and other currents, the following equation (13) is obtained:

$$R_6 \cdot (I_f + IQ_1 + IQ_2) + R_8 \cdot IQ_2 = V_{CC} - V_{BE}Q_3 \tag{13}$$

$$\therefore I_f = \frac{V_{CC} - V_{BE}Q_3}{R_6} - IQ_1 - \left(1 + \frac{R_8}{R_6}\right) IQ_2 \tag{14}$$

where $V_{CC}$ is the power source potential; $V_{BE}Q_3$ is the voltage drop between base and emitter of the transistor $Q_3$; $IQ_1$ and $IQ_2$ are currents respectively flowing in transistors $Q_1$ and $Q_2$.

In the equation (14), $V_{CC}$, $V_{BE}Q_3$, $IQ_1$ and $IQ_2$ can be set by circuit design, so that the current $I_f$ is easily set to a constant value. This means that the product of $IQ_3 \cdot IQ_4$ is usually held at a constant, not zero. Accordingly, one of the power transistors $Q_3$ and $Q_4$ is kept in a non-cutoff condition while the other increases to a large value. Moreover, the other is prevented from excessively increasing because the former is kept at a value not zero.

Figure 2:
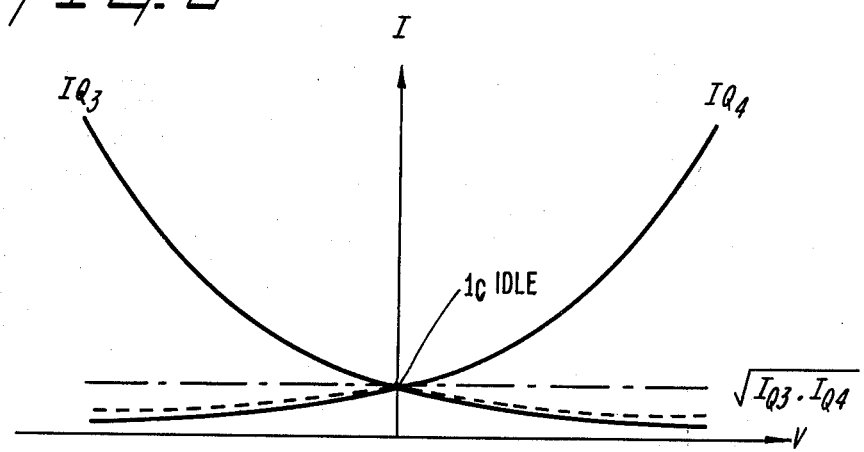
FIG. 2 graphically illustrates current variations flowing through transistors shown in FIG. 1.

FIG. 2 shows the response characteristcs of the currents $IQ_3$, $IQ_4$ and $I_C$, referring to the output voltage Vout at output terminal 14. The currents $IQ_3$ and $IQ_4$ respectively take the same defined current values $I_C$ when no input signal is given to the input terminal 24 and, therefore, the output voltage Vout is zero. The current $I_C$ is given by equation (15), and is defined as a control current at non-input signal time:

$$I_C = \sqrt{N \cdot M \cdot I_f} \tag{15}$$

From the equations (15) and (14), it is understood that the control current $I_C$ is easily established to the desired value. Then, the currents $IQ_3$ and $IQ_4$ increase and decrease inversely to each other in accordance with the polarity of the input signal. The current variations of currents $IQ_3$, $IQ_4$ are shown by the unbroken lines in FIG. 2.

According to the first embodiment of this invention described above, the power amplifier of which the output stage is constructed with NPN transistors without an inverse Darlington connection by a PNP-NPN pair is easily obtained, and the first embodiment is especially suitable for an $I_C$ circuit technique because the output stage can be constructed with NPN transistors only. Thus, an amplifier with high power efficiency is obtained by reason of no resistors being necessary between the output terminal and the output transistors for producing idling currents. Furthermore, both output transistors are always kept in an ON condition so that the output signal has no clipping or crossover distortion.

Figure 3:
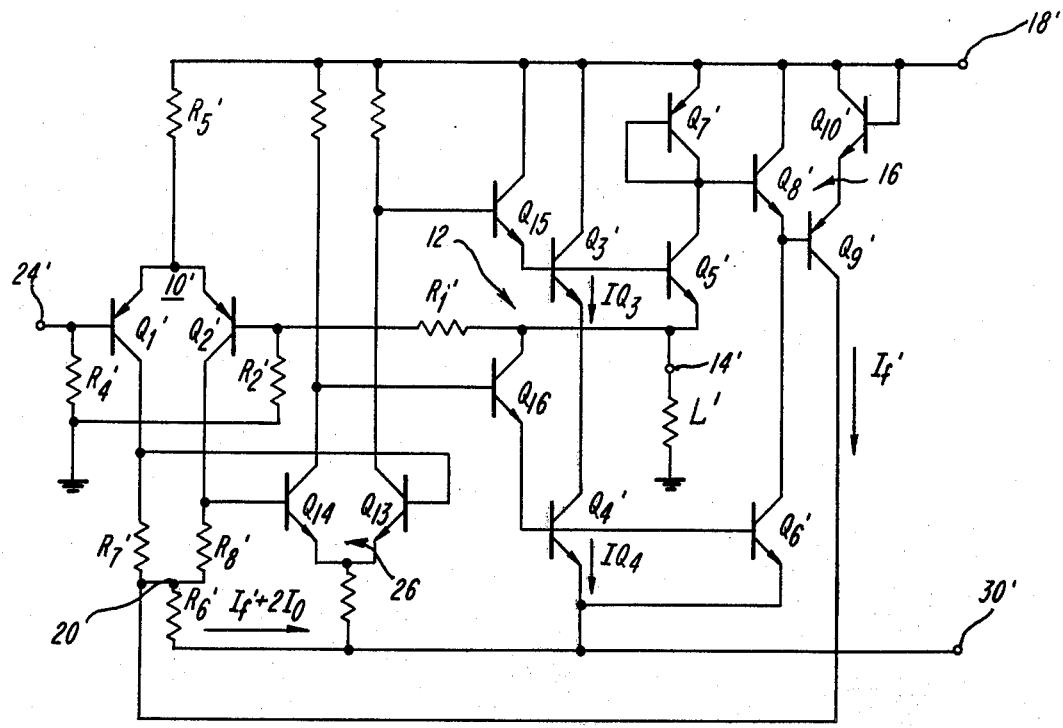
FIG. 3 shows a detailed schematic circuit diagram of another power amplifier embodying the present invention.

The first embodiment described above may be modified as shown in FIG. 3. This modification is an amplifier in which a driver stage 26 in a differential amplifier with a pair of NPN transistors $Q_{13}$, $Q_{14}$ is employed, and the output stage 12' is constructed by two pairs of Darlington connections by NPN transistors $Q_{15}$, $Q_3'$ and $Q_{16}$, $Q_4'$. The current $I_f$ is directly fed back to the junction 20' without using a current mirror circuit. The preamplification stage 10' is constructed by PNP transistors.

In this modification, similar effects as those of the first embodiment are obtained, and a larger output power than that of the first embodiment is obtained.

Figure 4:
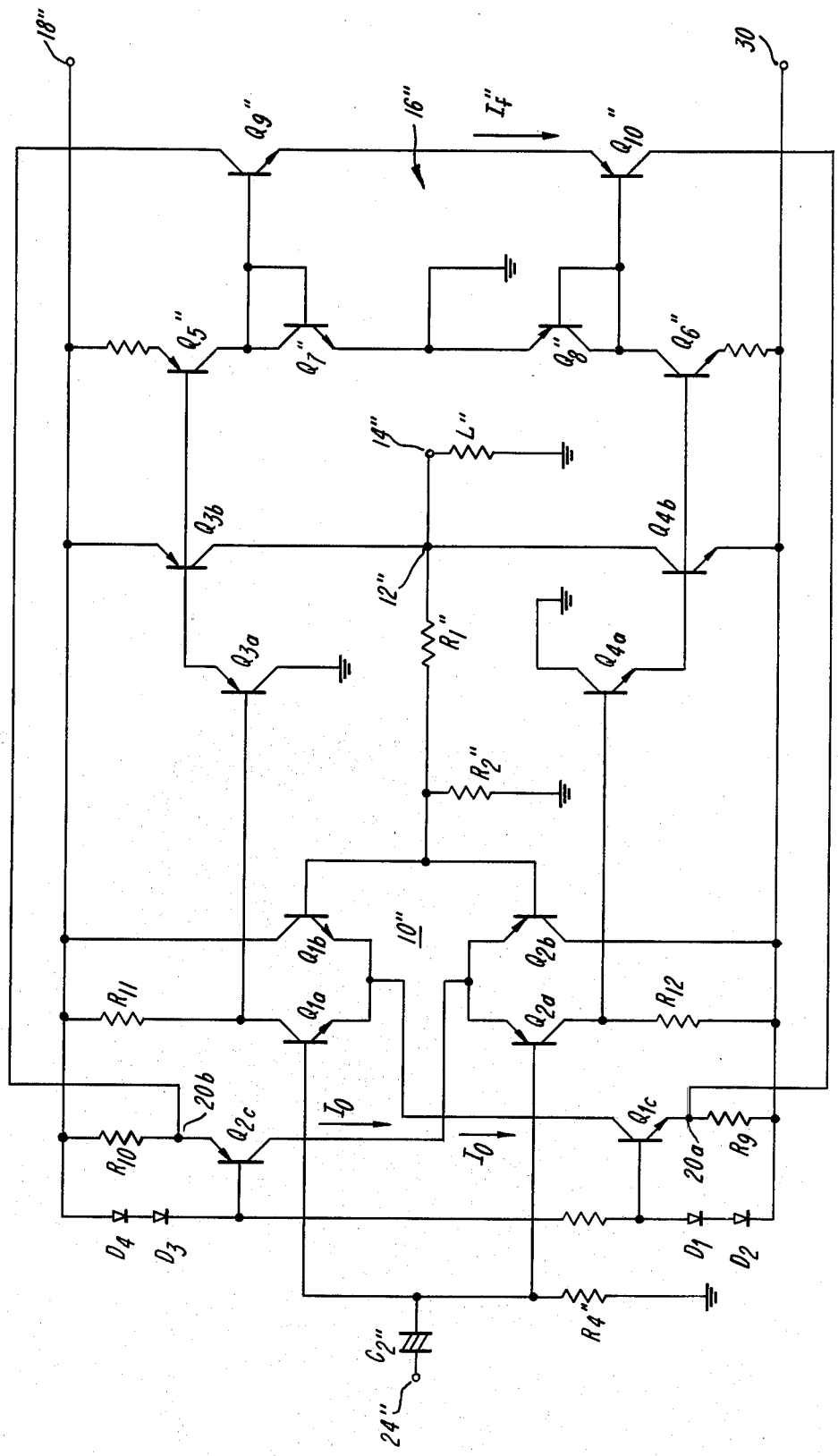
FIG. 4 shows a detailed schematic circuit diagram of still another power amplifier embodying the present invention.

Referring now to FIG. 4, there is shown an amplifier of which an output stage is constructed in a complementary SEPP amplifier configuration with two emitter-grounded amplifier sections.

A preamplifier stage 10" is in the form of a push-pull amplifier including two differential amplifier sections, each having a pair of NPN transistors $Q_{1a}$, $Q_{1b}$ and a pair of PNP transistors $Q_{2a}$, $Q_{2b}$. Stage 10" drives an output stage 12". The output stage 12" includes two emitter-grounded amplifier sections each constructed by a Darlington connection by transistor pairs $Q_{3a}$, $Q_{3b}$ and $Q_{4a}$, $Q_{4b}$. Collectors of the PNP power transistor $Q_{3b}$ and the NPN power transistor $Q_{4b}$ are directly connected to the common output terminal 14", and output stage 12" drives the load L" through the output terminal 14". A feedback through resistors $R_1"$ and $R_2"$ provides an operating point stabilization of the voltage drops across the power transistors $Q_{3b}$ and $Q_{4b}$, in the same manner as in the first embodiment.

The input coupling network containing resistor $R_4"$ and the input impedances of the transistors $Q_{1a}$ and $Q_{2a}$ connected at the bases in parallel determines the low frequency roll-off of the amplifier since the remainder of the amplifier is essentially direct-coupled. Specifically, the collectors of transistors $Q_{1a}$ and $Q_{2a}$ are respectively direct-coupled to the bases of transistors $Q_{3a}$ and $Q_{4a}$ in the output stage 12".

Circuits which include transistors $Q_{1c}$, $Q_{2c}$, diodes $D_1$, $D_2$, $D_3$ and $D_4$ and resistors $R_9$, $R_{10}$, operate the constant current supplying circuits for the differential amplifier sections in the preamplification stage 10". Resistors $R_{11}$ and $R_{12}$, respectively, operate as collector load resistors of the transistors $Q_{1a}$ and $Q_{2a}$.

Determining idling currents for the power transistors $Q_{3b}$ and $Q_{4b}$ is achieved by further circuits including transistors $Q_5"$, $Q_6"$, $Q_7"$, $Q_8"$, $Q_9"$ and $Q_{10}"$ connected between the bases of the power transistors $Q_{3b}$ and $Q_{4b}$ and the preamplification stage 10". Base-emitter paths of PNP transistor $Q_5"$ and NPN transistor $Q_6"$ are respectively coupled to the base-emitter paths of the power transistors $Q_{3b}$ and $Q_{4b}$ in parallel for detecting currents $IQ_{3b}$ and $IQ_{4b}$ which flow through the power transistors $Q_{3a}$ and $Q_{3b}$. Thus, if each ratio of the emitter area of the transistors $Q_{3b}$, $Q_{4b}$ to that of the transistors $Q_5"$, $Q_6"$ is N, currents $IQ_5"$ and $IQ_6"$ flowing through the transistors $Q_5"$ and $Q_6"$ are respectively related by equations (16) and (17).

$$IQ_5'' = 1/N \cdot IQ_{3b} \tag{16}$$
$$IQ_6'' = 1/N \cdot IQ_{4b} \tag{17}$$

These currents $IQ_5"$ and $IQ_6"$ are combined and arithmetically operated upon in operating circuit 16" comprising transistors $Q_7"$, $Q_8"$, $Q_9"$ and $Q_{10}"$. NPN transistor $Q_7"$ is connected between transistor $Q_5"$ and ground, and PNP transistor $Q_8"$ is connected between transistor $Q_6"$ and ground. The currents $IQ_5"$ and $IQ_6"$, respectively, flow through transistors $Q_7"$ and $Q_8"$, and raise the base-emitter voltages $V_{BE}(Q_7")$ and $V_{BE}(Q_8")$ at the transistors $Q_7"$ and $Q_8"$. These base-emitter voltages $V_{BE}(Q_7")$ and $V_{BE}(Q_8")$, respectively, vary in accordance with the currents IQ$_5''$ and IQ$_6''$, and are related by equations (18) and (19).

$$V_{BE}(Q_7'') = \frac{KT}{q} \cdot \ln \frac{IQ_5''}{I_{SN}} = \frac{KT}{q} \cdot \ln \frac{IQ_{3b}}{N \cdot I_{SN}} \quad (18)$$

$$V_{BE}(Q_8'') = \frac{KT}{q} \cdot \ln \frac{IQ_6''}{I_{SP}} = \frac{KT}{q} \cdot \ln \frac{IQ_{4b}}{N \cdot I_{SP}} \quad (19)$$

Transistors $Q_7''$ and $Q_8''$ are, respectively, connected at their collectors to their own bases and to the bases of transistors $Q_9''$ and $Q_{10}''$, respectively. Transistors $Q_9''$ and $Q_{10}''$ are connected at their emitters to each other and are respectively connected at their collectors to the junctions 20a and 20b of the emitters of transistors $Q_{1c}$, $Q_{2c}$ and the resistors $R_9$, $R_{10}$. Referring to the voltage drops between the bases of transistors $Q_9''$ and $Q_{10}''$, the equation (20) is obtained.

$$V_{BE}(Q_9'') + V_{BE}(Q_{10}'') = V_{BE}(Q_7'') + V_{BE}(Q_8'') \quad (20)$$

Now, the current $I_f'$ flowing through the transistors $Q_9''$ and $Q_{10}''$ in series from the junction 20b to the junction 20a has following the relations (21) and (22) to the base-emitter voltages $V_{BE}(Q_9'')$ and $V_{BE}(Q_{10}'')$:

$$V_{BE}(Q_9'') = \frac{KT}{q} \cdot \ln \frac{I_f'}{I_{SN}} \quad (21)$$

$$V_{BE}(Q_{10}'') = \frac{KT}{q} \cdot \ln \frac{I_f'}{I_{SP}} \quad (22)$$

Using the equations (18), (19), (21) and (22), the equation (20) is rewritten as below:

$$\frac{KT}{q}\left(\ln \frac{I}{N \cdot I_{SN}} + \ln \frac{I}{N \cdot I_{SP}}\right) = \frac{KT}{q}\left(\ln \frac{I_f'}{I_{SN}} + \ln \frac{I_f'}{I_{SP}}\right) \quad (23)$$

From the equation (23), the following equation is obtained:

$$I_f' = \frac{1}{N} \cdot \sqrt{IQ_{3b} \cdot IQ_{4b}} \quad (24)$$

This current $I_f'$ is drawn out from the junction 20b and poured into the junction 20a and works as a feedback signal for controlling the preamplification stage 10''. Referring to the voltage drops by the current $I_f'$ and other currents, the following equations (25) and (26) are obtained.

$$2V_D = R_A(I_o + I_f') + V_{BE} \quad (25)$$

$$R_C \cdot \frac{I_o}{2} = 2V_{BE} (= V_{BE}(Q_{4a}) + V_{BE}(Q_{4b})) \quad (26)$$

where, $V_D$ is each forward voltage drop of diodes $D_1$, $D_2$, $D_3$ and $D_4$, $R_A$ is each resistance of resistors $R_9$ and $R_{10}$, $I_o$ is each current flowing through transistors $Q_{2c}$ and $Q_{1c}$, and is one half the current flowing through transistors $Q_{2a}$, $Q_{2b}$ and $Q_{1a}$, $Q_{1b}$ constituting the differential amplifier sections, Rc is each resistance of resistors $R_{11}$ and $R_{12}$, and $V_{BE}$ is each base-emitter voltage of transistors $Q_{1c}$, $Q_{2c}$, $Q_{3a}$, $Q_{4a}$ and $Q_{4b}$.

From the equations (25) and (26) the following equation (27) is obtained:

$$I_f'' = \frac{2V_O - V_{BE}}{R_A} - \frac{4V_{BE}}{R_C} \quad (27)$$

In equation (27), $V_D$ and $V_{BE}$ are considered as constant, and $R_A$ and $R_C$ can be set by circuit design, so that the current may easily be established at a constant value. This means that the product IQ$_{3b}$ IQ$_{4b}$ is usually held at a constant value, not zero. Accordingly, one of the power transistors $Q_{3b}$ and $Q_{4b}$ is kept in a non-cutoff condition in its non-operating time. Moreover, the other is prevented from excessively increasing condition because the current through the former is kept at a value not zero.

When the input signal at the input terminal 24'' is zero and the output voltage Vout at the output terminal 14'' is zero, the currents IQ$_{3b}$ and IQ$_{4b}$ respectively take the same defined value $I_C''$. This current value $I_C''$ is given by equation (28), and defined as an idling current at a non-input signal time:

$$I_C'' = N \cdot I_f' \quad (28)$$

It is understood that idling current $I_C''$ is easily established to the desired value from the equations (28) and (27). Then, the currents IQ$_{3b}$ and IQ$_{4b}$ increase and decrease inversely to each other in accordance with the polarity of the input signal. These current variations show similar characteristics of $I_C$, IQ$_3$, and IQ$_4$ shown by FIG. 2.

According to the second embodiment of this invention described above, a basic circuit is obtained to establish an idling current for an SEPP amplifier which comprises at the output stage two emitter-grounded amplifier sections coupled to a common output terminal. Furthermore, the output transistors are always kept in an ON condition so that the output signal has no crossover distortion.

Figure 5:
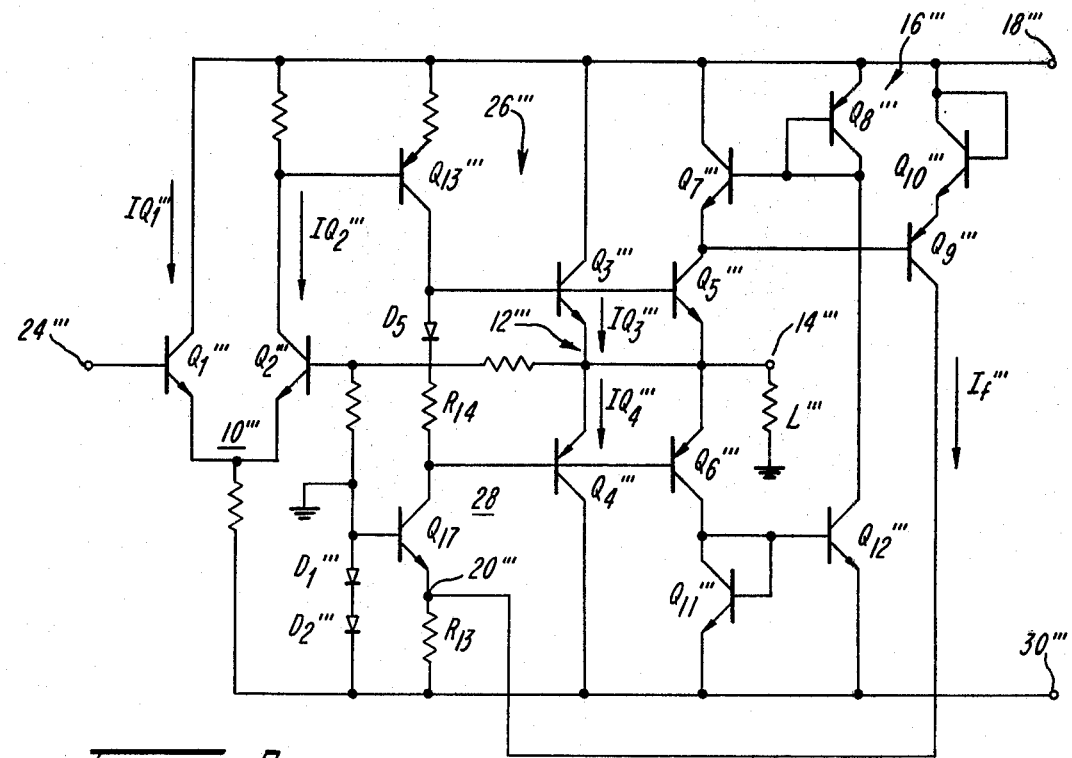
FIG. 5 shows a detailed schematic circuit diagram of one more power amplifier embodying the present invention.

Referring to FIG. 5, there is shown as amplifier of which an output stage is constructed in a complementary SEPP amplifier with conventional emitter-follower type amplifier sections connected to a common output terminal.

A preamplifier stage 10''' in the form of a differential amplifier including NPN transistors $Q_1'''$ and $Q_2'''$ drives a driver stage 26''' having a PNP transistor $Q_{13}'''$. Driver stage 26''' drives an output stage 12'''. Current mirror load circuit 28 comprises diodes $D_1'''$, $D_2'''$ and $D_5$, resistors $R_{13}$ and $R_{14}$, and transistor $Q_{17}$. The emitter of transistor $Q_{17}$ is coupled to terminal 30''' by resistor $R_{13}$, and the collector of transistor $Q_{17}$ is coupled to the collector of transistor $Q_{13}'''$ by the series connection of diode $D_5$ and resistor $R_{14}$. The base of transistor $Q_{17}$ is coupled to ground, with the series connection of diodes $D_1'''$ and $D_2'''$ also coupling the base of $Q_{17}$ to terminal 30'''.

Output stage 12''' includes an NPN power transistor $Q_3'''$ and a PNP power transistor $Q_4'''$ which are directly coupled at their emitters to a common output terminal 14''' and form a complementary SEPP type amplifier for driving a load L''' through common output terminal 14'''. Each power transistor $Q_3'''$ and $Q_4'''$ is connected in the form of an emitter-follower configuration. A feedback network, an input coupling network and a common emitter resistor are constructed in nearly the same arrangement as in the first embodiment (FIG. 1).

Determining the control current for the power amplifier is achieved by further circuits having transistors $Q_5'''$, $Q_6'''$, $Q_7'''$, $Q_8'''$, $Q_9'''$, $Q_{10}'''$, $Q_{11}'''$ and $Q_{12}'''$ connected between the bases of the power transistors $Q_3'''$, $Q_4'''$ and the driver stage 26'''. Base-emitter paths of the NPN transistor $Q_5'''$ and the PNP transistor $Q_6'''$ are respectively coupled to the base-emitter paths of the same conductivity type power transistors $Q_3'''$, $Q_4'''$ in parallel for detecting currents $IQ_3'''$ and $IQ_4'''$ which flow through the power transistors $Q_3'''$ and $Q_4'''$. So, if an emitter area ratio of NPN power transistor $Q_3'''$ to NPN transistor $Q_5'''$ is N and that of PNP power transistor $Q_4'''$ to PNP transistor $Q_6'''$ is M, currents $IQ_5'''$ and $IQ_6'''$ flowing through the transistors $Q_5'''$ are respectively related by equations (29) and (30):

$$IQ_5''' = 1/N \cdot IQ_3''' \quad (29)$$
$$IQ_6''' = 1/M \cdot IQ_4''' \quad (30)$$

These currents $IQ_5'''$ and $IQ_6'''$ are combined and arithmetically operated upon by operating circuit 16''' comprising transistors $Q_7'''$, $Q_8'''$, $Q_9'''$ and $Q_{10}'''$. NPN transistor $Q_7'''$ is connected with its emitter-collector path positioned between transistor $Q_5'''$ and the power source terminal 18'''. The emitter-collector path of PNP transistor $Q_8'''$ is connected in series with the emitter-collector path of transistor $Q_{12}'''$ between terminals 18''' and 30'''. The base of $Q_8'''$ is connected to the collector of $Q_8'''$ and to the base of $Q_7'''$. A current mirror circuit comprises a diode-connected NPN transistor $Q_{11}'''$ and transistor $Q_{12}'''$ with the emitter-collector path of $Q_{11}'''$ coupling the collector of $Q_6'''$ to terminal 30''', with the bases of $Q_{11}'''$ and $Q_{12}'''$ coupled together and to the collector of $Q_6'''$.

The currents $IQ_5'''$ and $IQ_6'''$ thus respectively flow through transistors $Q_7'''$ and $Q_8'''$, and raise the forward base-emitter voltages $V_{BE}(Q_7''')$ and $V_{BE}(Q_8''')$ at transistors $Q_7'''$ and $Q_8'''$. These forward base-emitter voltages $V_{BE}(Q_7''')$ and $V_{BE}(Q_8''')$, respectively, vary in accordance with the currents $IQ_5'''$ and $IQ_6'''$, and are related by equations (31) and (32).

$$V_{BE}(Q_7''') = \frac{KT}{q} \cdot \ln\frac{IQ_5'''}{I_{SN}} = \frac{KT}{q} \cdot \ln\frac{IQ_3'''}{N \cdot I_{SN}} \quad (31)$$

$$V_{BE}(Q_8''') = \frac{KT}{q} \cdot \ln\frac{IQ_6'''}{I_{SP}} = \frac{KT}{q} \cdot \ln\frac{IQ_4'''}{M \cdot I_{SP}} \quad (32)$$

The transistor $Q_8'''$ is connected at the collector to its own base and to the base of transistor $Q_7'''$, so that the emitter potential $Pe(Q_7''')$ of transistor $Q_7'''$ becomes the sum of both forward base-emitter voltages $V_{BE}(Q_7''')$ and $V_{BE}(Q_8''')$. Accordingly, the emitter potential $Pe(Q_7)$ is related by equation (33):

$$Pe(Q_7''') = V_{BE}(Q_7''') + V_{BE}(Q_8''') \quad (33)$$

To the emitter of the transistor $Q_7'''$, the base of the PNP transistor $Q_9'''$ is connected. The emitter of transistor $Q_9'''$ is connected to the power source terminal 18''' through the NPN transistor $Q_{10}'''$ of which the base is connected to power source terminal 18''', so that the sum of forward base-emitter voltages $V_{BE}(Q_9''')$ and $V_{BE}(Q_{10}''')$ of the series transistors $Q_9'''$ and $Q_{10}'''$ is provided by the emitter potential $Pe(Q_7''')$. Accordingly, the equation (34) is obtained:

$$V_{BE}(Q_9''') + V_{BE}(Q_{10}''') = V_{BE}(Q_7''') + V_{BE}(Q_8''') \quad (34)$$

As a result, the sum $V_{BE}(Q_9''')+V_{BE}(Q_{10}''')$ varies in accordance with the potential $Pe(Q_7''')$ or the sum $V_{BE}(Q_7''')+V_{BE}(Q_8''')$. A current $I_f'''$ flowing through the series transistors $Q_9'''$ and $Q_{10}'''$ to a junction 20''' of an NPN transistor $Q_{17}'''$ and a resistor $R_{13}'''$ (which comprises current mirror load 28 for the driver transistor $Q_{13}'''$) also varies in accordance with the potential $Pe(Q_7''')$. The base-emitter voltages $V_{BE}(Q_9''')$ and $V_{BE}(Q_{10}''')$ are respectively given by equations (35) and (36) in relation to the current $I_f'''$:

$$V_{BE}(Q_9''') = \frac{KT}{q} \cdot \ln\frac{I_f'''}{I_{SP}} \quad (35)$$

$$V_{BE}(Q_{10}''') = \frac{KT}{q} \cdot \ln\frac{I_f'''}{I_{SN}} \quad (36)$$

Equation (34) may be rewritten as follows, using the equations (31), (32), (35) and (36):

$$\frac{KT}{q} \cdot \ln\frac{I_f'''}{I_{SP}} + \frac{KT}{q} \cdot \ln\frac{I_f'''}{I_{SN}} = \frac{KT}{q} \cdot \ln\frac{IQ_3'''}{N \cdot I_{SN}} + \frac{KT}{q} \cdot \ln\frac{IQ_4'''}{M \cdot I_{SP}} \quad (37)$$

From the equation (37), the following equation is obtained:

$$I_f''' = \sqrt{\frac{1}{N \cdot M} \cdot IQ_3''' \cdot IQ_4'''} = R \cdot \sqrt{IQ_3''' \cdot IQ_4'''} \quad (38)$$

The current $I_f'''$ flows into junction 20''' and works as a feedback signal for controlling driver stage 26'''. Referring to the voltage drops by the current $I_f'''$ and other currents, the following equations (39) and (40) are obtained:

$$2V_D = R_A \cdot (I_o + I_f''') + V_{BE} \quad (39)$$
$$V_D + R_C \cdot I_o = 2V_{BE} \quad (40)$$

where, $V_D$ is each forward voltage drop (=0.7 V) of the diodes $D_1'''$, $D_2'''$, and $D_5$ in the current mirror load 28, $R_A$ is a resistance of the resistor $R_{13}$, $I_o$ is a current flowing through the driver transistor $Q_{13}'''$ and transistor $Q_{17}$, $V_{BE}$ is each forward base-emitter voltage of the transistors $Q_3'''$ and $Q_4'''$, and $R_C$ is a resistance of resistor $R_{14}$.

From the equations (39) and (40), the following equation (41) is obtained:

$$I_f''' = \frac{2V_D - V_{BE}}{R_A} - \frac{2V_{BE} - V_D}{R_C} \quad (41)$$

In this equation, $V_D$ and $V_{BE}$ are considered as constant, and $R_A$ and $R_C$ can be set by circuit design. Accordingly, current $I_f'''$ is also established at a constant value.

Thus, power transistors $Q_3'''$ and $Q_4'''$ are prevented from becoming cutoff or from having excessively increasing current.

An idling current $I_C'''$ for keeping the power transistors $Q_3'''$ and $Q_4'''$ non-cutoff condition in a non-operating condition is also given by equation (42) as was the case in the above mentioned embodiments:

$$I_C''' = \sqrt{N \cdot M \cdot I_f''} \qquad (42)$$

Idling current $I_C'''$ is easily established to the desired value, and then the variations of currents $IQ_3'''$, $IQ_4'''$ can be shown as the same as in FIG. 2. Accordingly, also in the third embodiment of this invention there is shown a circuit to establish the idling current for power transistors and to keep the power transistors in a non-cutoff condition at anytime or prevent the currents flowing through the power transistors excessively increasing. Moreover, resistors connected between the power transistors and the output terminal in the conventional SEPP amplifier for flowing the idling currents are not necessary in this embodiment, so the power efficiency is higher than in conventional amplifiers.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or scope of applicant's general inventive concept.

What is claimed is:

1. A power amplifier comprising:
   (a) a preamplification stage;
   (b) an output stage driven by said preamplification stage and having power transistors each coupled to a common output terminal;
   (c) current detecting transistors connected in parallel at their base-emitter paths to the base-emitter paths of said power transistors for detecting currents flowing through said power transistors, respectively;
   (d) an operating circuit coupled to said current detecting transistors, said operating circuit generating a feed back current which has a function related to the product of the respective currents through said power transistors; and
   (e) means for feeding back said feed back current from said operating circuit to said preamplification stage for keeping said feed back current constant.

2. A power amplifier according to claim 1, further comprising a driver stage between said preamplification stage and said output stage.

3. A power amplifier according to claim 1 or 2, wherein said output stage comprises a pair of one conductivity type power transistors in which one of said power transistors is wired in a form of emitter-follower configuration and the other of said power transistors is wired in a form of grounded-emitter configuration.

4. A power amplifier according to claim 3, wherein said one conductivity type power transistors are NPN power transistors.

5. A power amplifier according to claim 3, wherein said power transistors are each composite transistors each connected in a Darlington configuration.

6. A power amplifier according to claim 5, wherein said composite transistors are each NPN transistors.

7. A power amplifier according to claim 1 or 2, wherein the output stage comprises a pair of complementary power transistors each coupled in a grounded-emitter amplifier configuration.

8. A power amplifier according to claim 7, wherein said power transistors are each composite transistors each connected in a Darlington configuration.

9. A power amplifier according to claim 1 or 2, wherein said output stage is constructed by a pair of complementary power transistors each wired in an emitter-follower amplifier.

10. A power amplifier according to claim 1 or 2, wherein said operating circuit comprises:
    (a) first and second transistors connected with emitter-collector path in series, respectively, to the emitter-collector paths of said current detecting transistors;
    (b) first means for connecting the base-emitter paths of said first and second transistors in series;
    (c) third and fourth transistors;
    (d) second means for connecting the base-emitter paths of said third and fourth transistors in series circuit and for connecting the series base-emitter paths of third and fourth transistors in parallel with said base-emitter paths of said first and second transistors; and
    (e) third means for connecting at least one of the collectors of said third and fourth transistors to said feedback means.

11. A power amplifier according to claim 10 wherein:
    (a) said first transistor is a first conductivity type transistor connected at the collector to one of said current detecting transistors and to its own base and connected at the emitter to a power source terminal;
    (b) said second transistor is an opposite conductivity type transistor connected at the emitter to the other one of said current detecting transistors at the collector to said power terminal;
    (c) said first means is a connection between the bases of said first and second transistors;
    (d) said third transistor is a transistor of said first conductivity type;
    (e) said fourth transistor is a transistor of said opposite conductivity type and is connected at the collector to both said power source terminal and to its own base; and
    (f) said second means is a connection between the emitters of said third and fourth transistors and between the emitter of said second transistor and the base of said third transistor.

12. A power amplifier according to claim 10 wherein
    (a) said first and second transistors are opposite conductivity type transistors respectively connected at their collectors to one of said current detecting transistors and to their own base;
    (b) said first means is a connection between emitters of said first and second transistors;
    (c) said third and fourth transistors are opposite conductivity type transistors; and
    (d) said second means is a connection between the bases of said third and fourth transistors and further is a connection between the bases of said first and third transistors and between bases of said second and fourth transistors.

* * * * *